United States Patent [19]
Sutherland et al.

[11] Patent Number: 5,955,898
[45] Date of Patent: Sep. 21, 1999

[54] SELECTOR AND DECISION WAIT USING PASS GATE XOR

[75] Inventors: Ivan E. Sutherland, Santa Monica; William S. Coates, Redwood City; Jon K. Lexau, Mountain View, all of Calif.

[73] Assignee: Sun Microsystems, Inc., Palo Alto, Calif.

[21] Appl. No.: 08/885,169

[22] Filed: Jun. 30, 1997

[51] Int. Cl.[6] .............................................. H03K 19/0948
[52] U.S. Cl. ........................................... 326/121; 326/121
[58] Field of Search ...................... 395/309, 310, 395/311, 312, 728, 729, 730, 731, 732, 551, 552, 555, 556, 557, 558, 899; 326/52, 53, 54, 55, 17, 37, 96, 99, 21, 39, 41, 121, 40, 113, 93, 38; 327/403, 404, 141

[56] References Cited

U.S. PATENT DOCUMENTS

| | | | |
|---|---|---|---|
| 3,783,254 | 1/1974 | Eichelberger | 364/700 |
| 5,687,107 | 11/1997 | Igurn | 326/768 |
| 5,767,696 | 6/1998 | Choi | 326/56 |
| 5,808,483 | 9/1998 | Sako | 326/113 |

*Primary Examiner*—Richard L. Ellis
*Attorney, Agent, or Firm*—Finnegan, Henderson, Farabow, Garrett & Dunner, L.L.P.

[57] ABSTRACT

A logic gate includes a plurality of pass gates forming a double rail pass gate XOR or reversing switch providing the same functionality as a conventional XOR gate. Consequently, the pass gate XOR can substitute for XOR gates in circuits such as a selector circuit and decision wait circuit, but with faster responses and fewer transistors than the conventional XOR gate. Each pass gate includes a P-type and an N-type transistor coupled in parallel. A control input and its complement are coupled to the gates of the transistors to selectively pass signals at the input of the pass gate to its output.

2 Claims, 13 Drawing Sheets

Prior Art

Prior Art

PRIOR ART

SELECTOR AND DECISION WAIT USING PASS GATE XOR

BACKGROUND OF THE INVENTION

The present invention relates generally to the field of logic elements, and more particularly to the field of exclusive OR logic elements with pass gates forming reversing switches for use in selector and decision wait circuits.

Exclusive OR gates form an important part of asynchronous design. Asynchronous systems act on events occurring at unpredictable times, unlike a synchronous system having a clock determining when to execute an action. One frequently used method for encoding events in asynchronous systems is transition encoding. In transition encoding, any change in the level of a signal represents an event, whether the change is from false to true (i.e. low signal to high signal) or true to false (high to low). Thus, the asynchronous system reacts to changes in signal levels representing events to trigger an action or a response.

Figure 1:
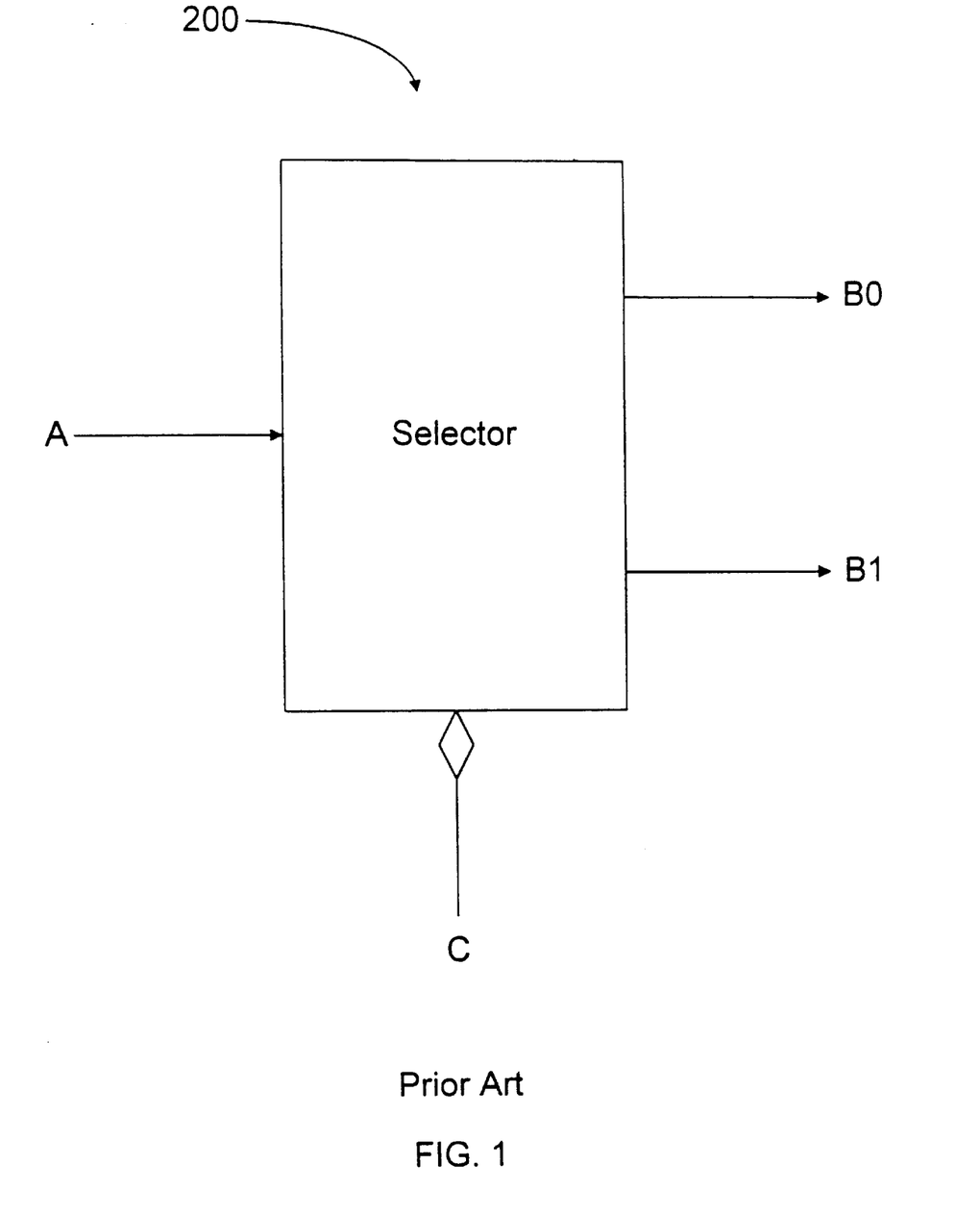
FIG. 1 is a block diagram of a conventional selector circuit.

Asynchronous systems have long used selector circuits for transition encoding of events to initiate an action, but they need XOR gates to reset their inputs. As shown in FIG. 1, a selector circuit has one event input, A, two event outputs, B0 and B1, and one level input, C. When an event arrives at input A of the selector, the selector delivers an event to output B0 or B1. The Boolean value of input C selects which output gets the event. If C is true, the event appears at output B1. If C is false, the event appears at output B0.

Figure 2:
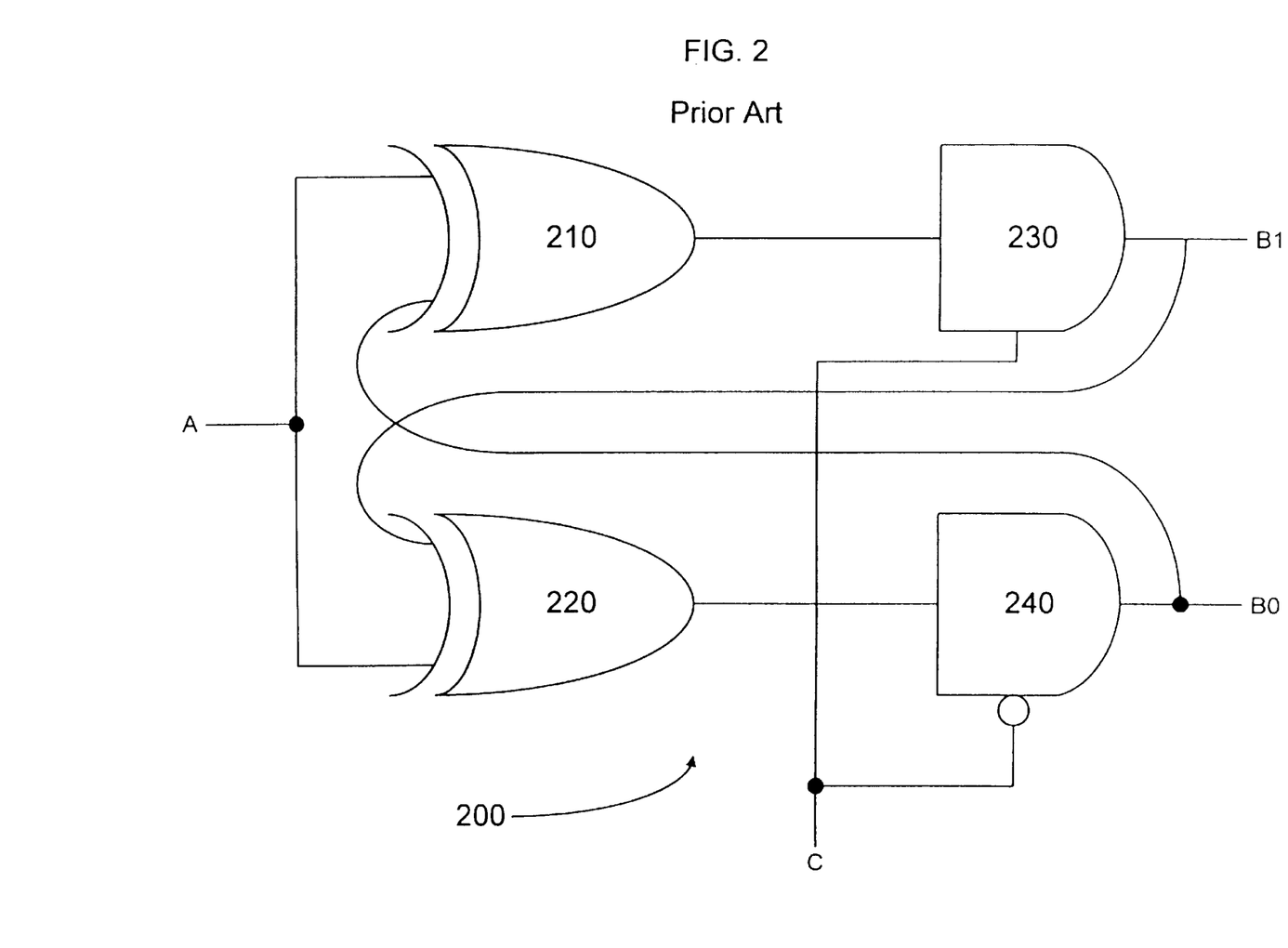
FIG. 2 is a circuit diagram of the selector circuit of FIG. 1.

FIG. 2 shows a well-known circuit representation for a selector circuit 200. Circuit 200 includes a pair of XOR gates, 210 and 220, and a pair of waiton gates, 230 and 240. Waiton gates 230 and 240 are essentially latches controlled by their side input. Each waiton gate passes the level at its input to its output if its side input is true. Therefore, waiton gate 230 passes the signal at its input if C is true. Waiton gate 240 passes the signal at its input if C is false because the side input of waiton gate 240 inverts the signal from level input C. In operation, an event arriving at input A passes through both XOR gates, presenting an event to both waiton gates. Depending on the level of level input C, only one waiton gate passes the event to output B1 or B0.

To operate properly, selector circuit 200 must reset the state pending at the input to the unused waiton gate, the waiton gate not enabled to pass the event to a corresponding output. Otherwise, an event received at input A could pass to both outputs of selector circuit 200. Each event received at input A should only pass to one output, not both.

To reset the state at the input of the unused waiton gate, selector circuit 200 includes a cross-connection from the outputs of waiton gates 230 and 240 to the inputs of XOR gates 210 and 220. Consequently, the input to the unused waiton gate is changed twice for each event received at input A, once when the event from input A passes through the XOR gate connected to that gate and again when the output of the active waiton gate passes its output event through that same XOR gate. For instance, assume an event at input A passes through XOR gates 210 and 220 to the inputs of waiton gates 230 and 240, respectively. Assuming C is true, the event passes from the output of waiton gate 230 to output B1. The event passed through waiton gate 230 also causes XOR gate 220 to reset the input of waiton gate 240.

Figure 3:
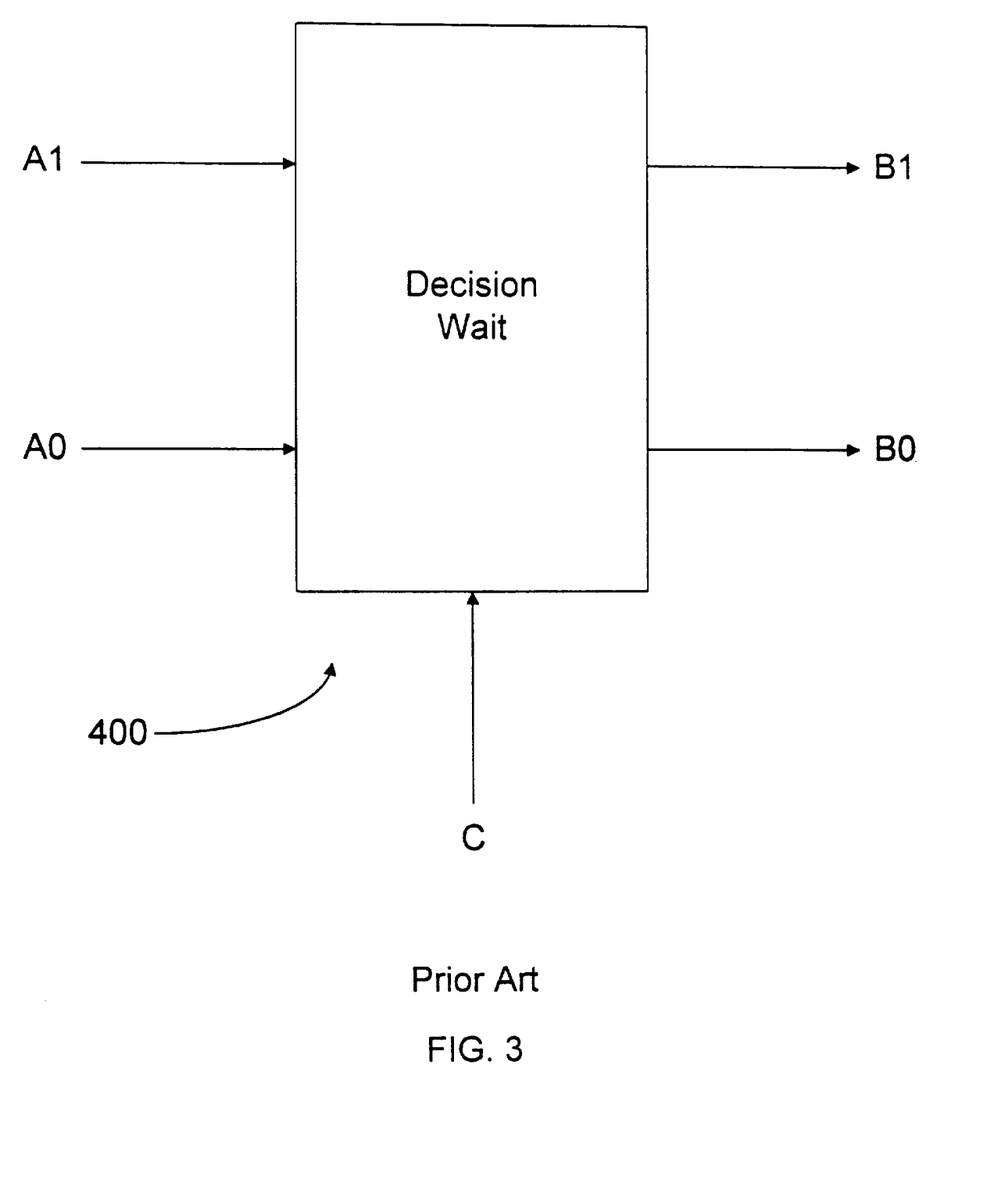
FIG. 3 is a block diagram of a conventional decision wait circuit.

Selector circuit 200 is not the only circuit used in asynchronous systems to steer events. For example, a decision wait circuit can also be used in asynchronous systems using transition encoding of events. As shown in FIG. 3, the decision wait circuit includes two event inputs A0 and A1, two event outputs B0 and B1, and a third event input C. The decision wait circuit must be allowed to respond to an event at input A0 before applying an event at input A0 or A1 again or to an event at input A1 before applying an event at input A0 or A1 again. The decision wait circuit produces an event on output B1 in response to the later arriving of events at inputs C and A1, and produces an event on output B0 in response to the later arriving of events at inputs C and A0.

Figure 4:
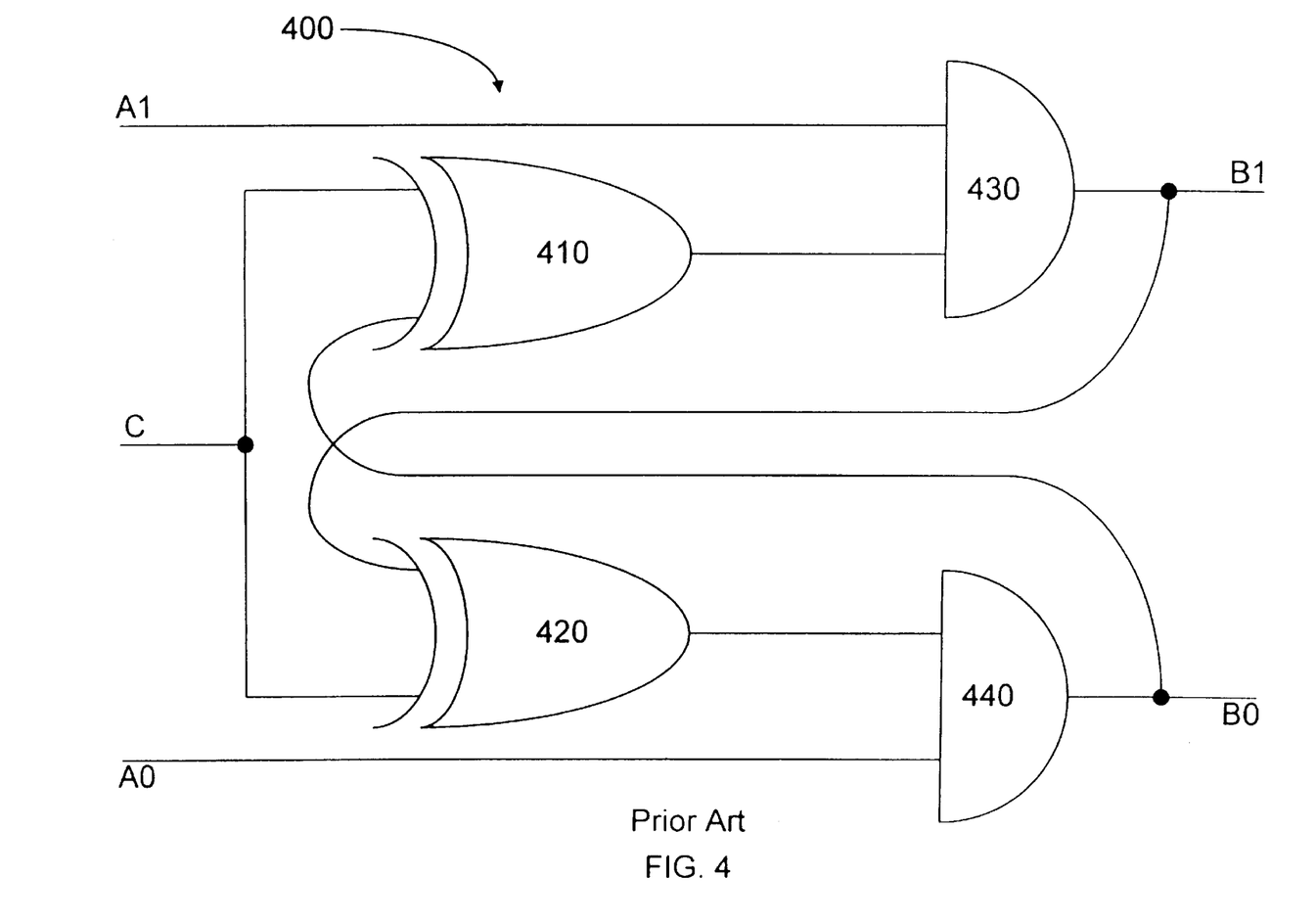
FIG. 4 is a circuit diagram of the decision wait circuit of FIG. 3.

FIG. 4 shows a logic diagram for a decision wait circuit 400. Circuit 400 includes two XOR gates, 410 and 420, and two Muller C-elements, 430 and 440. When an event arrives at input C, XOR gates 410 and 420 pass the event into the inner inputs of Muller C-elements 430 and 440, respectively. A Muller C-element fires, i.e., changes its output from high to low or low to high, when both of its inputs receive an event. With the circuit connected as shown, an event at input C would appear at inputs of Muller C-elements 430 and 440. When both Muller C-elements receive the event at input C, Muller C-element 430 fires if it also receives an event from input A1, and Muller C-element 440 fires if it also receives an event from input A0.

Like selector circuit 200, decision wait circuit 400 must reset the state at the input of the unused Muller C-element. To reset the input, decision wait circuit 400 also includes a cross connection from the event outputs to the inputs of the XOR gates. As a result, the input to the unused Muller C-element is set twice, once when the event from input C passes through the XOR gate connected to the unused Muller C-element, and again when the output of the active Muller C-element passes the output event through that same XOR gate. For instance, assuming an event at input C passes through XOR gates 410 and 420 to the inputs of Muller C-elements 430 and 440, respectively, and assuming input A1 receives an event, Muller C-element 430 will fire. XOR gate 420, coupled at an input to the output of Muller C-element 430, again passes an event to Muller C-element 440 to remove the erroneous event.

Figure 5:
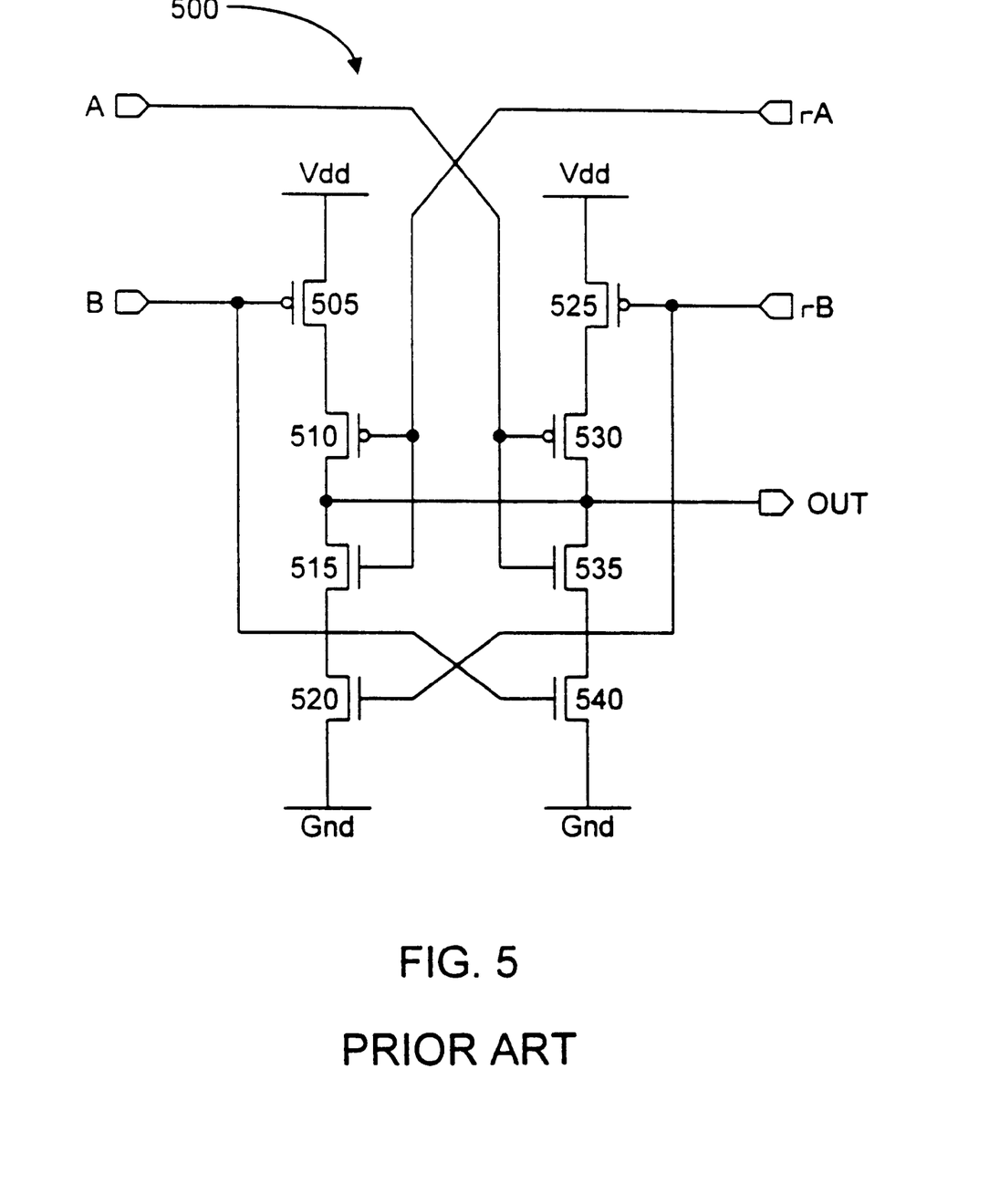
FIG. 5 is a circuit diagram of a conventional XOR circuit.

Both selector circuit 200 and decision wait circuit 400 use a pair of XOR gates, which conventionally require eight transistors. For example, FIG. 5 shows a conventional XOR gate including eight transistors 510, 520, 530, 540, 550, 560, 570, and 580. This large number of transistors contributes to higher costs and greater space requirements on a chip. In addition, conventional XOR gates often generate substantial delays. Therefore, to reduce cost and improve performance, the XOR gates in the selector and decision wait circuits should include fewer transistors and lower delays.

SUMMARY OF THE INVENTION

In accordance with the present invention, a logic gate has been designed to optimize performance for circuits, such as selector and decisions wait circuits, that use XOR gates. The logic gate takes advantage of the unique nature of an XOR gate, that an input event always produces an output event, to design a circuit in place of an XOR gate that always produces an output event in response to an input event. In particular, when signals are carried in double rail form with each encoded in true and complement form on separate wires, a pair of pass gates provide a logic gate functionally equivalent to an XOR gate, thus providing an alternative logic gate for double rail logic circuits using XOR gates.

The following description, as well as the practice of the invention, set forth and suggest additional advantages and purposes of this invention. The elements and combinations set forth in the claims achieve these advantages and purposes. As embodied, a logic gate, consistent with this invention, for producing an output logic signal representing a logical operation of a input logic signal and a control logic signal includes first, second, third, and fourth input terminals receiving, respectively, the input logic signal, the control logic signal, an inverted input logic signal representing the logical inverse of the input logic signal, and an inverted control logic signal representing the logical inverse of the control logic signal; a first pass gate; a second pass gate, and a first output terminal. The first pass gate includes a first transistor of a first type having a first channel coupled at a first end to the first input terminal and having a first gate coupled to the second input terminal; and a second transistor of a second type, different from the first type, having a second channel coupled at a first end to the first input terminal and at a second end to a second end of the first channel, and having a second gate coupled to the fourth input terminal. The second pass gate includes a third transistor of a second type having a third channel coupled at a first end to the third input terminal and having a third gate coupled to the second input terminal; and a fourth transistor of a first type having a fourth channel coupled at a first end to the third input terminal and at a second end to a second end of the third channel, and having a fourth gate coupled to the fourth input terminal. The first output terminal, coupled to the second end of the first, second, third, and fourth channels, provides the output logic signal.

Where the first and fourth transistors are P-type transistors, and the second and third transistors are N-type transistors, the output logic signal represents an exclusive OR operation of the input and control logic signals. Where the first and fourth transistors are N-type transistors, and the second and third transistors are P-type transistors, the output logic signal represents an exclusive NOR operation of the input and control logic signals.

Both the foregoing general description and the following detailed description provide examples and explanations only. They do not restrict the claimed invention.

DESCRIPTION OF THE DRAWINGS

The accompanying drawings, which are incorporated in and constitute a part of this specification, illustrate embodiments of the invention and, together with the description, explain the advantages and principles of the invention. In the drawings.

DESCRIPTION OF THE PREFERRED EMBODIMENT

Reference will now be made to various embodiments according to this invention, examples of which are shown in the accompanying drawings and will be obvious from the description of the invention. In the drawings, the same reference numbers represent the same or similar elements in the different drawings whenever possible.

Figure 6A:
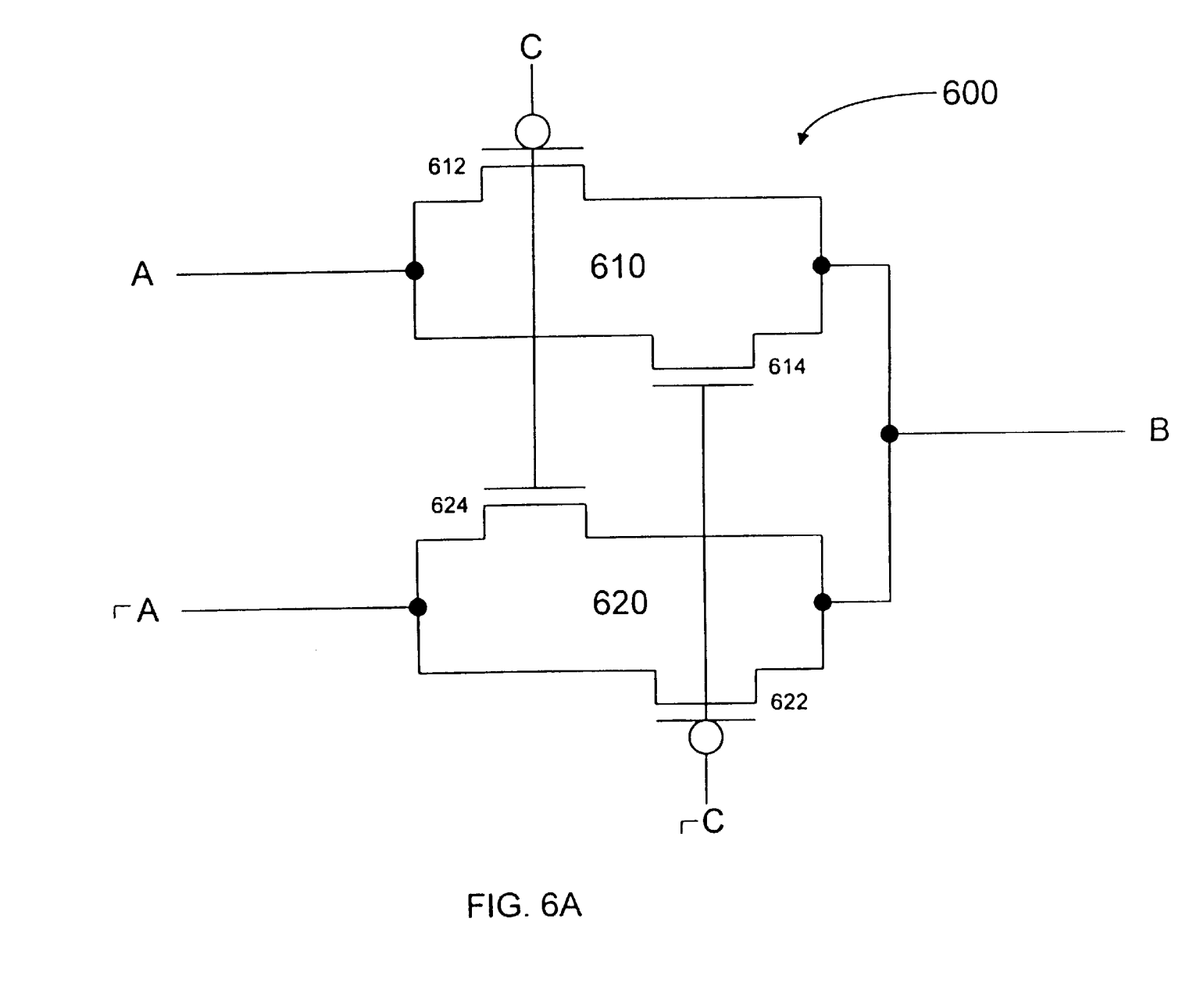
FIG. 6A is a circuit diagram for a pass gate XOR consistent with the present invention.

This invention relates to the use of a logic gate built with pass gates that form a reversing switch for use in selector and decision wait circuits. FIG. 6A shows a circuit diagram for pass gate XOR 600, a logic gate formed by a pair of pass gates arranged to function as an XOR gate. Pass gate XOR 600 includes pass gates 610 and 620, one for inputs A and one for inverted input ⌐A. Control signals C and ⌐C control pass gates 610 and 620, and the outputs of gates 610 and 620 combine to form output signal B.

Pass gates 610 and 620 each include a parallel-coupled N-type transistor and P-type transistor, P-type transistor 612 and N-type transistor 614 in gate 610 and P-type transistor 622 and N-type transistor 624 in gate 620. Inputs A and ⌐A connect to the side of the channels of transistor pairs 612–614 and 622–624, respectively, and output B connect to the other side of those channels. Signal C connects to the gates of transistors 612 and 624, and signal ⌐C connects to the gates of transistors 614 and 622.

In each pass gate, the N-type transistor will pass a low signal when its gate receives a high signal, and the P-type transistor will pass a high signal when its gate receives a low signal. The N-type and P-type transistors in each pass gate receive complementary signals at their respective gates such that both transistors either conduct or do not conduct. Moreover, since a conducting N-type transistor can pass a low signal and a conducting P-type transistor can pass a high signal, each pass gate, when conducting, will pass the signal level received at its input to its output.

In pass gate XOR 600, the level of control input C determines which pass gate conducts. When C is false (i.e. low) and ⌐C is true (i.e. high), pass gate 610 conducts and B is the value of A. Thus B is true only when A is true and C is false because the gates of P-type transistor 612 receives the low signal from C, and the gate of N-type transistors 614 receives the high signal from ⌐C. When C is true and ⌐C is false, pass gate 620 conducts, passing a signal at input ⌐A to output B. Thus, B is true when A is false and C is true. Consequently, pass gate XOR 600 processes input A and control input C as two inputs of an XOR gate.

An XOR gate provides a unique function not found in other logic gates. Every time either input to an XOR gate changes its level, the output also changes its level. When encoding events, an XOR gate produces a corresponding event at its output every time one of its inputs receives an event.

The primary purpose of the respective XOR gates in both selector circuit 200 and decision wait circuit 400 is to provide the functionality just described, i.e., producing an event output every time an event is received. Therefore, pass gate XOR 600 can substitute for the XOR gates used for selector circuit 200 and decision wait circuit 400. Pass gate XOR 600, however, requires fewer transistors and yields faster response times than conventional XOR gates. Thus, it costs less and has better performance.

Figure 6B:
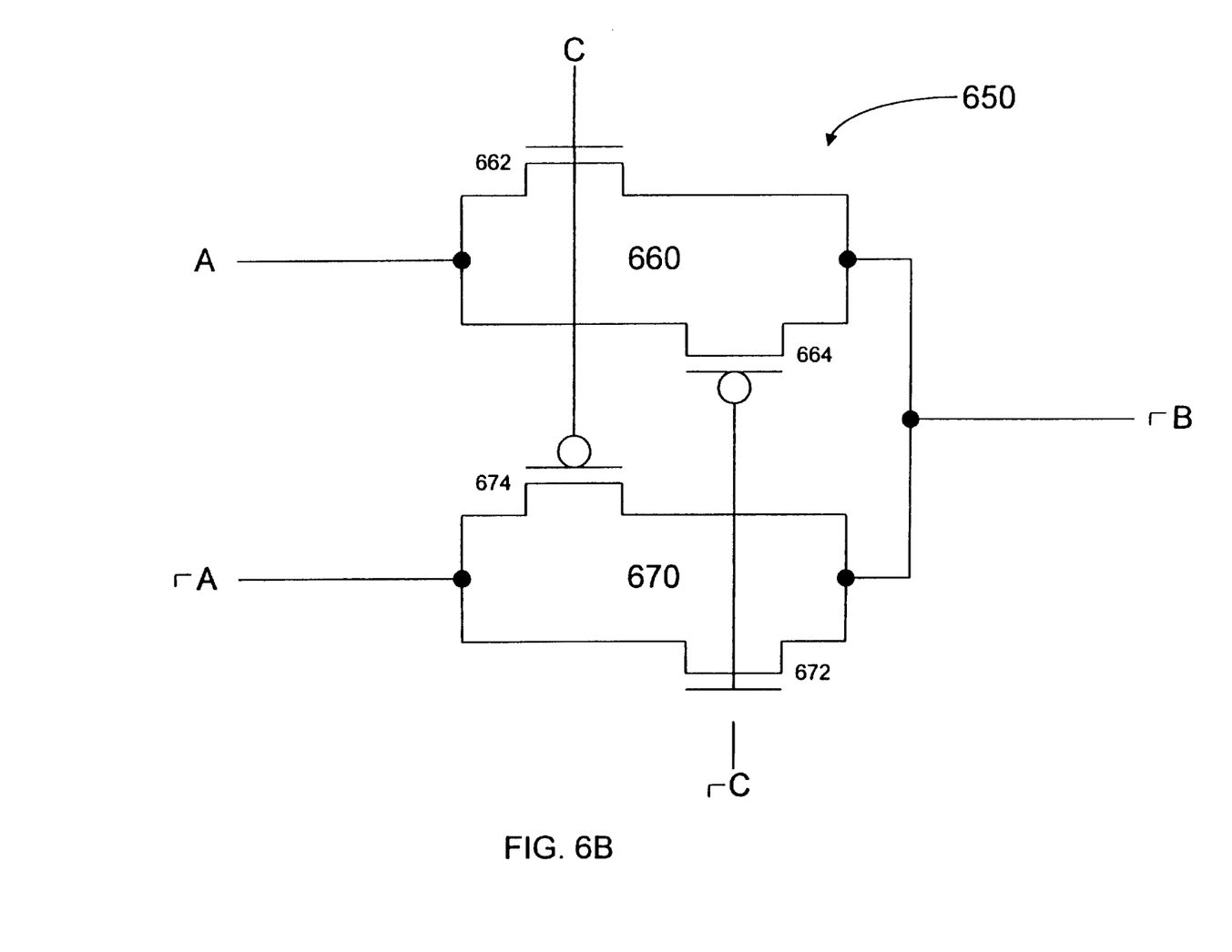
FIG. 6B is a circuit diagram for a pass gate XNOR consistent with the present invention.

FIG. 6B is a circuit diagram of a pass gate XNOR 650 consistent with this invention. Pass gate XNOR 650 is identical to pass gate XOR 600 except that the transistor types of each pass gate are reversed. In FIG. 6B, pass gate XNOR 650 includes pass gates 660 and 670. Like pass gate XOR 600, pass gate XNOR 650 also includes inputs A and ⌐A, and control inputs C and ⌐C, but has output ⌐B. Each of the elements of pass gate XNOR 650 connect to the inputs and outputs in the same fashion as the elements of pass gate XOR 600.

Figure 6C:
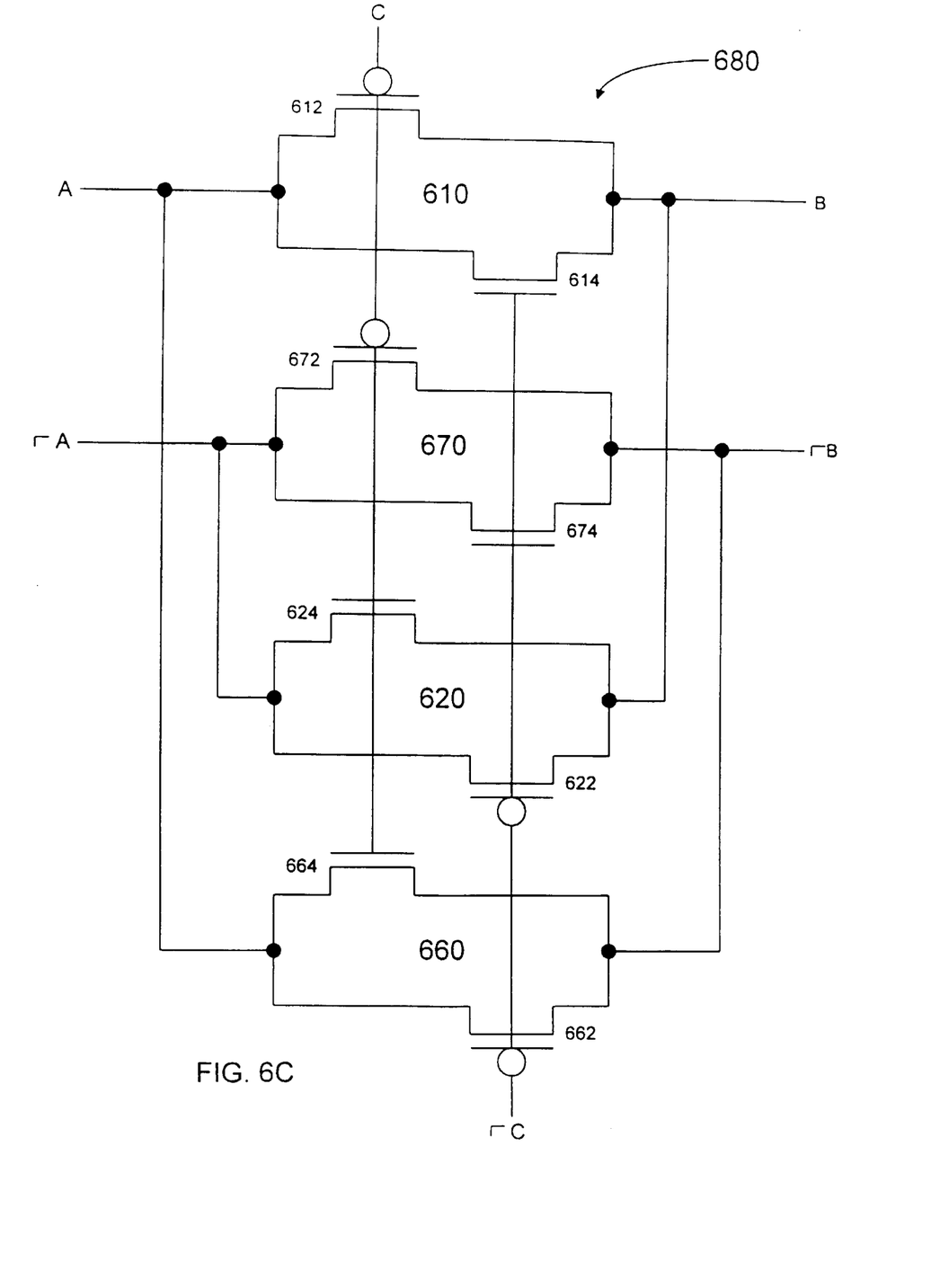
FIG. 6C is a circuit diagram for a pass gate XOR and pass gate XNOR of FIGS. 5A and 5B combined into a single circuit.

FIG. 6C is a circuit diagram combining both pass gate XOR 600 and pass gate XNOR 650 into a single circuit or reversing switch 680. The pass gates and transistors forming the pass gates correspond directly to the pass gates and transistors of pass gate XOR 600 and pass gate XNOR 650. Reversing switch 680 provides a complete double rail system having both noninverted and inverted signals at all inputs and outputs.

Figure 7:
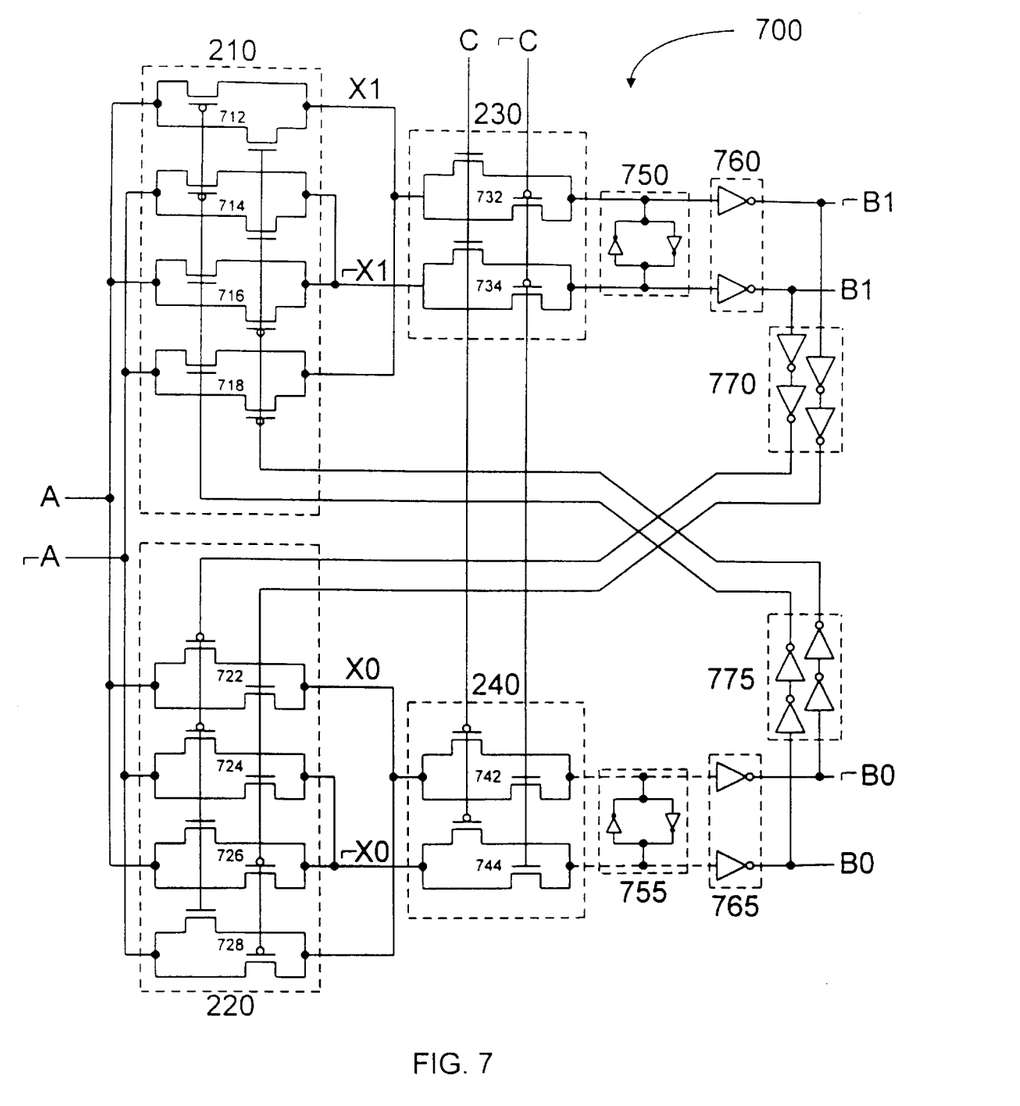
FIG. 7 is a circuit diagram for a selector circuit consistent with the present invention.

FIG. 7 shows a detailed circuit diagram of a selector circuit 700, related to FIG. 2, using reversing switches in place of XOR gates. Selector circuit 700 includes two reversing switches 210 and 220, two waiton gates 230 and 240, two keeper circuits 750 and 755, and two amplifier circuits 760 and 765. Selector circuit 700 also includes event input A and its complement ⌐A, event outputs B1, B0 and their respective complements ⌐B1 and ⌐B0, intermediate event outputs X1, X0 and their respective complements ⌐X1 and ⌐X0, and level input C and its complement ⌐C.

Reversing switch 210 includes four pass gates 712, 714, 716, and 718. Pass gates 712 and 716 both receive input A, and pass gates 714 and 718 both receive input ⌐A. Output B0 is coupled to the gate of the P-type transistor in pass gates 712 and 714 and to the gate of the N-type transistor in pass gates 716 and 718. Output ⌐B0 is coupled to the gate of the N-type transistor in pass gates 712 and 714 and to the gate of the P-type transistor in pass gates 716 and 718. Pass gates 712 and 718 both output signals to intermediate output X1, and pass gates 714 and 716 both output signals to intermediate output ⌐X1.

Reversing switch 220, like reversing switch 210, includes four pass gates 722, 724, 726, and 728. Pass gates 722 and 726 both receive input A, and pass gates 724 and 728 both receive input ⌐A. Output B1 is coupled to the gate of the P-type transistor in pass gates 722 and 724 and to the gate of the N-type transistor in pass gates 726 and 728. Output ⌐B1 is coupled to the gate of the N-type transistor in pass gates 722 and 724 and to the gate of the P-type transistor in pass gates 726 and 728. Pass gates 722 and 728 both output signals to intermediate output X0, and pass gates 724 and 726 both output signals to intermediate output ⌐X0.

Waiton gate 230 and waiton gate 240 are double rail elements because each element includes wires carrying the true and complement for each input and output signal. Waiton gate 230 includes two pass gates 732 and 734. Pass gates 732 and 734 receive the intermediate outputs X1 and ⌐X1, respectively. Control input C is coupled to the gate of the N-type transistor in pass gates 732 and 734, and control input ⌐C is coupled to the P-type transistor in pass gates 732 and 734. The outputs of pass gates 732 and 734 pass through inverters 760 to produce signals at event outputs ⌐B1 and B1, respectively. When control input C is true (high signal), the signal at intermediate output X1 is produced at output B1, and the signal at intermediate output ⌐X1 is produced at output ⌐B1.

Waiton gate 240 also includes two pass gates 742 and 744. Pass gates 742 and 744 and inverters 765 operate in the same fashion as pass gates 732 and 734 and inverters 760. Thus, when control input C is false (low signal), the signal at intermediate output X0 is produced at output B0, and the signal at intermediate output ⌐X0 is produced at output ⌐B0.

The outputs from pass gates 732 and 734 are coupled together by a keeper circuit 750, and the outputs from pass gates 742 and 744 are coupled by a keeper circuit 755. Each keeper circuit includes a pair of cross-coupled inverters to retain the state of the outputs of the transistors to which they attach, but are small enough to be driven to a new state by the outputs of the transistors in pass gates 732, 734, 742, and 744.

Event outputs B1 and ⌐B1 are cross-connected to the control input of reversing switch 720. The two paths forming the cross-connection each include optional amplifiers 770 including two (as shown) or more serially-coupled inverters in each path. Other amplifiers known in the art could also be used. Event outputs B0 and ⌐B0 are similarly cross-connected to the control input of reversing switch 710 using optional amplifiers 775.

As an example of the operation of selector circuit 700, assume no event has been received by event input A, the signal level at event input A and event outputs B1 and B0 are all low, and level input C is indeterminate. For simplicity, the discussion of the corresponding complementary signals will be left out. The low signal at B0 sets reversing switch 710 to pass the low signal from input A to intermediate output X1 by way of pass gate 712. Similarly, the low signal at B1 sets reversing switch 720 to pass the low signal from input A to intermediate output X0 by way of pass gate 722. Therefore, the signal levels at both intermediate outputs X1 and X0 are low.

When event input A receives an event, its signal level changes to high. The event received by input A passes through reversing switches 710 and 720 to change the signal levels at intermediate outputs X1 and X0 from low to high. Level input C determines which event output will receive the event received by input A. If C is high, the signal level at X1 passes to event output B1, with pass gate 732 thus changing the signal level at B1 from low to high.

Event output B1, cross-coupled as a control input to reversing switch 720, passes the event received from intermediate output X1 to intermediate output X0 by way of pass gate 728. The reception of another event at intermediate output X0 eliminates the erroneous event pending at intermediate output X0 and resets the signal level at intermediate output X0 to low.

Figure 8:
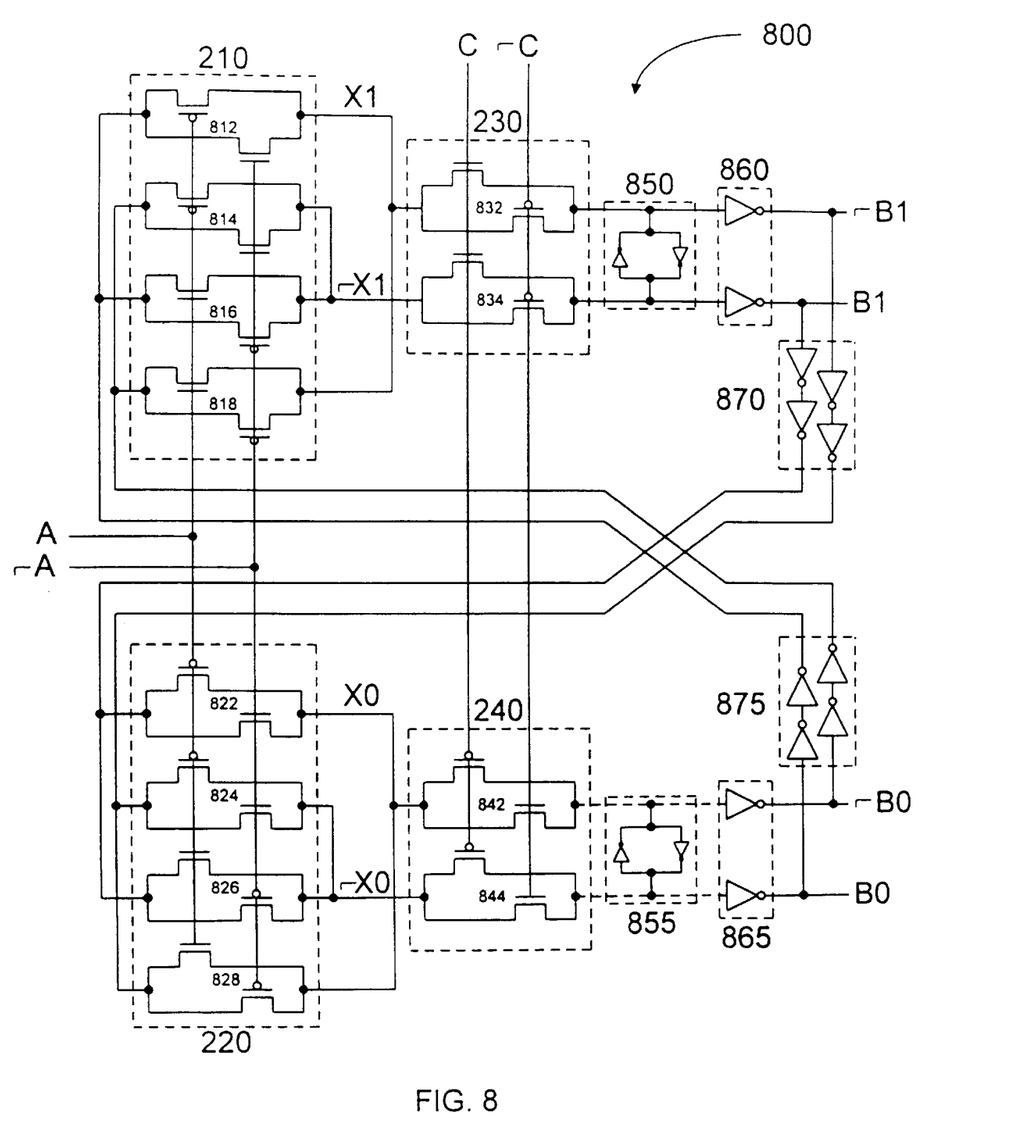
FIG. 8 is a circuit diagram for another embodiment of the selector circuit of FIG. 7.

FIG. 8 shows a circuit diagram for another selector circuit 800. Selector circuit 800 is essentially identical to selector circuit 700 except for the connection of event input A and crosscoupled event outputs B0 and B1 to the reversing switches. In contrast to selector circuit 600, event input A acts as a control input for reversing switches 210 and 220 and event outputs B0 and B1 act as the event inputs for reversing switches 210 and 220, respectively. Both selector circuit 700 and selector circuit 800 operate equivalently.

Figure 9:
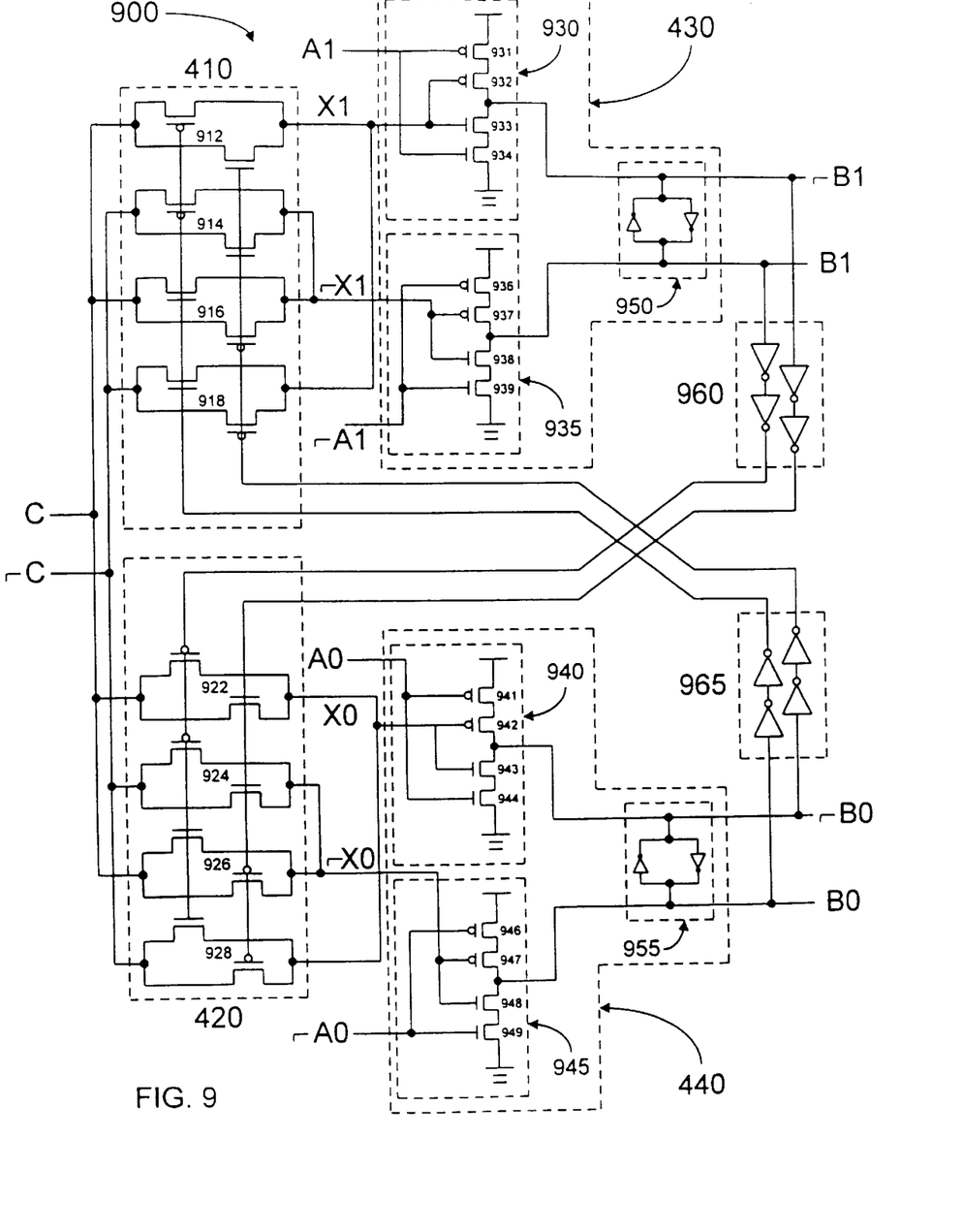
FIG. 9 is a circuit diagram for a decision wait circuit consistent with the present invention.

FIG. 9 shows a detailed circuit diagram of a decision wait circuit 900, related to FIG. 4, using reversing switches in place of XOR gates. The left side of decision wait circuit 900 is similar to the left side of selector circuit 700 in that decision wait circuit 900 includes event inputs C and ⌐C selectively coupled to pass gates forming reversing switches 410 and 420, and event outputs B0 and ⌐B0 and event outputs B1 and ⌐B1 coupled to the gates of the transistors of the pass gates in reversing switches 410 and 420, respectively.

However, the right side of decision wait circuit 900 is quite different from the right side of selector circuit 700. Instead of pass gates and inverters, decision wait circuit 900 includes two double rail Muller C-elements 430 and 440. Double rail Muller C-element 430 includes two single rail Muller C-elements 930 and 935 and a keeper circuit 950. Similarly, double rail Muller C-element 440 also includes two single rail Muller C-elements 940 and 945 and a keeper circuit 955. Double rail Muller C-elements 430 and 440 are double rail elements because each element includes wires carrying both the true and complement for each input and output signal, whereas single rail Muller C-elements 930, 935, 940, and 945 are single rail elements because they only include either the true or the complement for each input and output signal.

Each single rail Muller C-element includes two P-type transistors and two N-type transistors. The two P-type transistors are connected in series between Vdd and an output node , and the two N-type transistors are connected in series between ground (GND) and the output node. Each Muller C-element also receives two inputs, one coupled to the gate of one N-type transistor and the gate of one P-type transistor, and the other coupled to the respective gates of the other N-type and P-type transistors.

During operation, the single rail Muller C-elements only pass a signal to the output node if both the input signals are the same level. For example, if event input A1 and intermediate output X1 connected to single rail Muller C-element 930 are both low, single rail Muller C-element 930 passes a high signal from Vdd to output ⌐B1 by way of P-type transistors 931 and 932. Also, to change the level of the signal passed to the output, events have to be received at both inputs, i.e., event input A1 and intermediate output X1 for single rail Muller C-element 930. Therefore, if both inputs receive events to change their signal levels to high, single rail Muller C-element 930 pass a low signal from GND to output ⌐B1 by way of N-type transistors 933 and 934.

As an example of the operation of decision wait circuit 900, assume no event has been received by event inputs A0, A1, or C, and the signal level at event inputs A0, A1, and C and event outputs B0 and B1 are all low. Like the discussion of the operation of selector circuit 800, the discussion of the corresponding complementary signals will be left out. The low levels at B0 and B1 set reversing switches 410 and 420, respectively, to pass the signal level at C to intermediate outputs X1 and X0 by way of pass gates 912 and 922, respectively. The low signal levels at intermediate outputs X1 and X0, in conjunction with the low signals at event inputs A1 and A0, set the Muller C-elements to pass low signals to event outputs B1 and B0. Thus, decision wait circuit 900 is in a steady state.

Now assume that event input C receives an event. The event received at event input C passes through reversing switches 410 and 420 to intermediate outputs X1 and X0 by way of pass gates 912 and 922, respectively, changing the signal levels at intermediate outputs X1 and X0 to high. Until either event input A1 or A0 receives an event, neither event output will change. An event received at event input A1 sets single rail Muller C-elements 930 and 935 to pass an event to output B1, changing the signal level at output B1 to high. The changed signal level at output B1, because of the cross-coupled connection to the control input of reversing switch 420, causes the signal level an intermediate output X0 to revert to low, thus resetting the inputs of single rail Muller C-elements 940 and 945.

Figure 10:
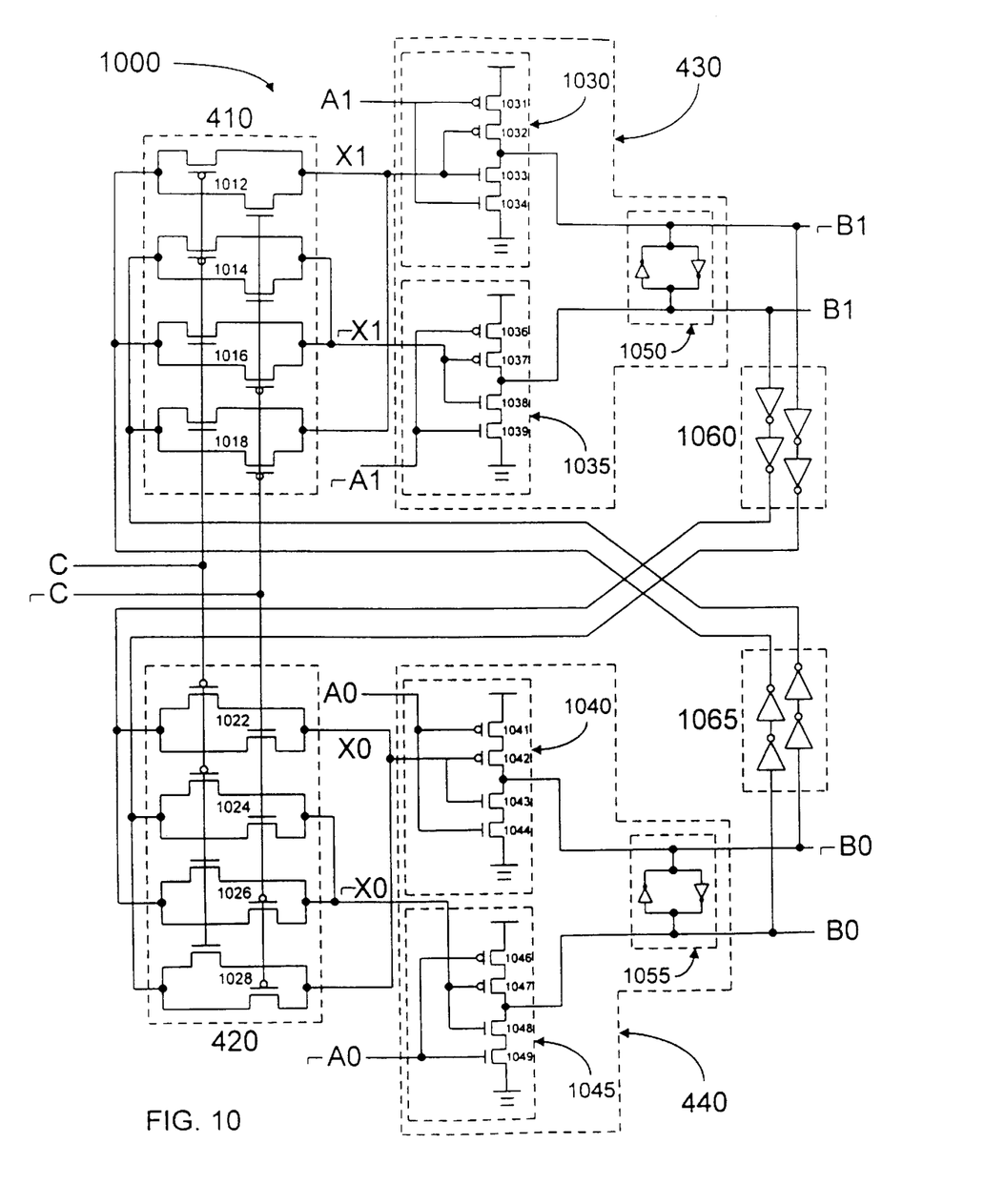
FIG. 10 is a circuit diagram for another embodiment of the decision wait circuit of FIG. 9.

FIG. 10 shows a circuit diagram for another decision wait circuit 1000. Decision wait circuit 1000 is essentially identical to decision wait circuit 900 except for the connection of event input C and cross-coupled event outputs B0 and B1 to the reversing switches. In contrast to decision wait circuit 900, event input C acts as a control input for reversing switches 410 and 420 and event outputs B0 and B1 act as the event inputs for reversing switches 410 and 420, respectively. Both decision wait circuit 900 and decision wait circuit 1000 operate equivalently.

Figure 11:
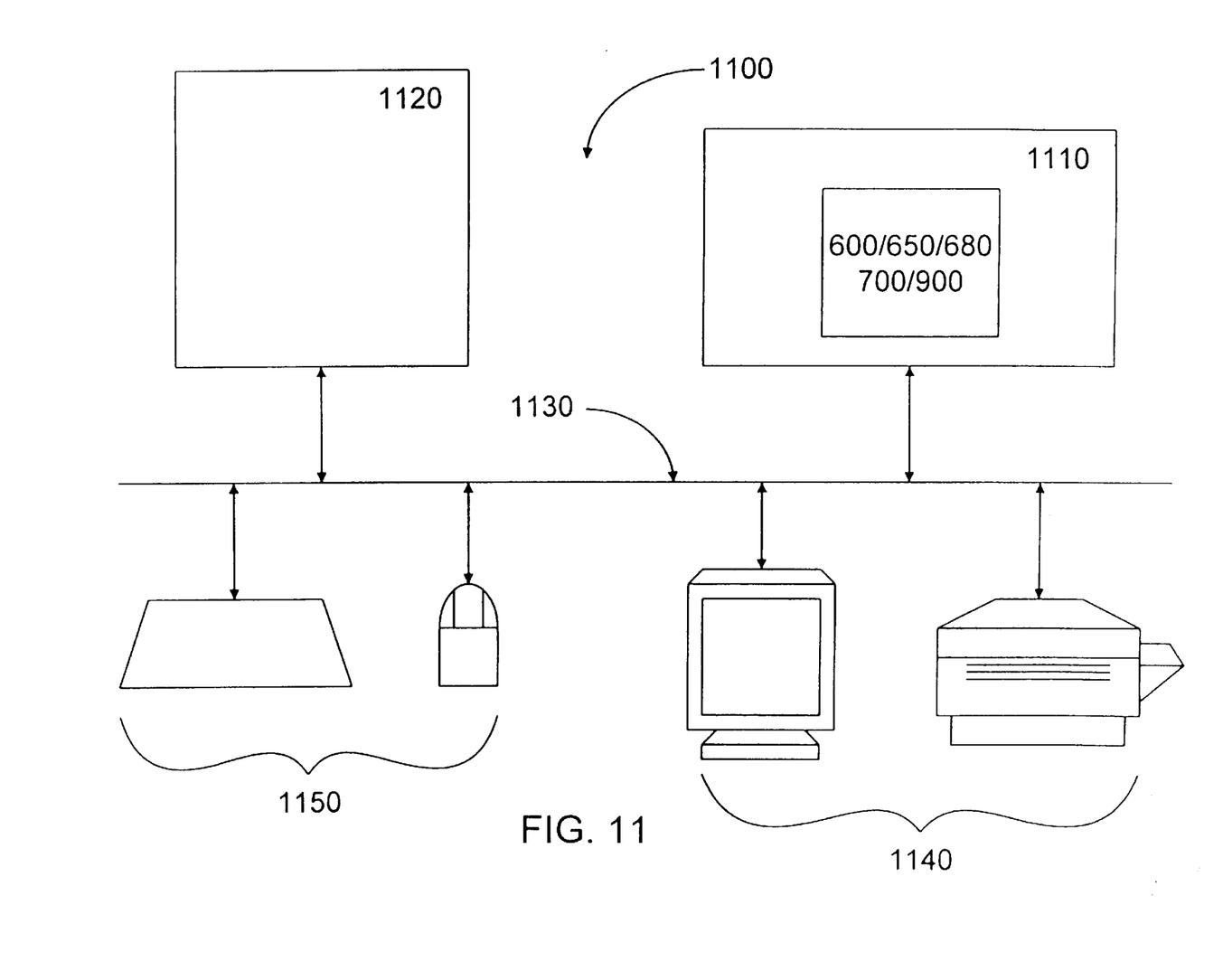
FIG. 11 is a diagram of a computer system including a logic gate according to the present invention.

Both selector circuit 700 and decision wait circuit 900 prove useful in modern computer systems. Computer systems today are required to perform ever increasing numbers of operations in ever decreasing amounts of time. For example, computer system 1100 shown in FIG. 11 includes a processor 1110 and memory 1120 coupled to processor 1110 through a bus 1130. Processor 1110 fetches from memory 1120 computer instructions and executes the fetched computer instructions. Processor 1110 also reads data from and writes data to memory 1120 and sends data and control signals through bus 1130 to one or more computer display devices 1140. Processor 1110 additionally receives data and control signals through bus 1130 from one or more computer user input devices 1150 in accordance with fetched and executed computer instructions.

To handle event logic processing, processor 1110 may include selector circuit 600 or decision wait circuit 800, which include the pass gate XOR 600 and pass gate XNOR 650 which form reversing switch 680. If computer system 1100 performs event-logic processing, processor 1110, and therefore reversing switch 680, may perform several operations for each event. As a result, the efficiencies described above with respect to pass gate XOR 600 according to the principles of the present invention realize substantial performance improvements when employed in computer systems such as computer system 1100.

CONCLUSION

Pass gate XOR circuits, consistent with this invention, use pass gates arranged to provide the same functionality as a conventional XOR gate. Consequently, the pass gate XOR can substitute for XOR gates in circuits such as a selector circuit and decision wait circuit. In addition, the pass gate XOR provides an advantage over the use of conventional XOR gates because it requires fewer transistors and yields faster response times, meaning lower cost and better performance.

It will be apparent to those skilled in the art that various modifications and variations can be made to disclosed embodiments of the present invention without departing from the scope or spirit of the invention. Other embodiments of the invention will be apparent to those skilled in the art from consideration of the specification and practice of the embodiments of the invention disclosed herein. The specification and examples should be considered exemplary, with the true scope and spirit of the invention being indicated by the following claims and their full range of equivalents.

What is claimed is:

1. A selector circuit for a logic gate receiving
   first and second complementary control signals,
   first and second complementary input signals, first and second complementary primary output signals,
first and second complementary secondary output signals, and
first and second waiton gates each having complementary inputs and outputs, the outputs of the first waiton gate producing the primary output signals, and the outputs of the second waiton gate producing the secondary output signals, the selector circuit comprising:
a first reversing switch including four pass gates,
- a first one of the pass gates being coupled to a first one of the inputs of the first waiton gate, being coupled to receive one of the first input signal or the second secondary output signal, and being responsive to the other one of the first input signal or the second secondary output signal,
- a second one of the pass gates being coupled to a second one of the inputs of the first waiton gate, being coupled to receive one of the second input signal or the first secondary output signal, and being responsive to the other one of the second input signal or the first secondary output signal,
- a third one of the pass gates being coupled to a second one of the inputs of the first waiton gate, being coupled to receive one of the first input signal or the second secondary output signal, and being responsive to the other one of the first input signal or the second secondary output signal, and
- a fourth one of the pass gates being coupled to a first one of the inputs of the first waiton gate, being coupled to receive one of the second input signal or the first secondary output signal, and being responsive to the other one of the second input signal or the first secondary output signal; and a second reversing switch including four pass gates,
- a first one of the pass gates being coupled to a first one of the inputs of the second waiton gate and, being coupled to receive one of the first input signal or the second primary output signal, and being responsive to the other one of the first input signal or the second primary output signal,
- a second one of the pass gates being coupled to a second one of the inputs of the second waiton gate and, being coupled to receive one of the second input signal or the first primary output signal, and being responsive to the other one of the second input signal or the first primary output signal,
- a third one of the pass gates being coupled to a second one of the inputs of the second waiton gate and, being coupled to receive one of the first input signal or the second primary output signal, and being responsive to the other one of the first input signal or the second primary output signal, and
- a fourth one of the pass gates being coupled to a first one of the inputs of the first waiton gate and, being coupled to receive one of the second input signal or the first primary output signal, and being responsive to the other one of the second input signal or the first primary output signal.

2. A decision wait circuit for a logic gate receiving
first and second complementary control signals,
first and second complementary primary input signals,
first and second complementary secondary input signals,
first and second complementary primary output signals,
first and second complementary secondary output signals, and
first and second Muller C-elements each having complementary primary and secondary inputs and complementary outputs, the primary inputs of the first Muller C-element receiving the primary input signals, the primary inputs of the second Muller C-element receiving the secondary input signals, the outputs of the first Muller C-element producing the primary output signals, and the outputs of the second Muller C-element producing the secondary output signals, the decision wait circuit comprising:
a first reversing switch including four pass gates,
- a first one of the pass gates being coupled to a first one of the secondary inputs of the first Muller C-element, being coupled to receive one of the first control signal or the second secondary output signal, and being responsive to the other one of the first control signal or the second secondary output signal,
- a second one of the pass gates being coupled to a second one of the secondary inputs of the first Muller C-element, being coupled to receive one of the second control signal or the first secondary output signal, and being responsive to the other one of the second control signal or the first secondary output signal,
- a third one of the pass gates being coupled to a second one of the secondary inputs of the first Muller C-element, being coupled to receive one of the first control signal or the second secondary output signal, and being responsive to the other one of the first control signal or the second secondary output signal, and
- a fourth one of the pass gates being coupled to a first one of the secondary inputs of the first Muller C-element, being coupled to receive one of the second control signal or the first secondary output signal, and being responsive to the other one of the second control signal or the first secondary output signal; and a second reversing switch including four pass gates,
- a first one of the pass gates being coupled to a first one of the secondary inputs of the second Muller C-element and, being coupled to receive one of the first control signal or the second primary output signal, and being responsive to the other one of the first control signal or the second primary output signal,
- a second one of the pass gates being coupled to a second one of the secondary inputs of the second Muller C-element and, being coupled to receive one of the second control signal or the first primary output signal, and being responsive to the other one of the second control signal or the first primary output signal,
- a third one of the pass gates being coupled to a second one of the secondary inputs of the second Muller C-element and, being coupled to receive one of the first control signal or the second primary output signal, and being responsive to the other one of the first control signal or the second primary output signal, and
- a fourth one of the pass gates being coupled to a first one of the secondary inputs of the first Muller C-element and, being coupled to receive one of the second control signal or the first primary output signal, and being responsive to the other one of the second control signal or the first primary output signal.

* * * * *